(12) United States Patent
Qin et al.

(10) Patent No.: US 11,502,209 B2
(45) Date of Patent: Nov. 15, 2022

(54) TRANSPARENT ELECTRODE, TRANSPARENT ELECTRODE PRODUCTION METHOD, DISPLAY PANEL, AND SOLAR CELL

(71) Applicant: Huawei Technologies Co., Ltd., Guangdong (CN)

(72) Inventors: Xudong Qin, Shenzhen (CN); Bo Zhang, Shenzhen (CN); Chenxiong Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 465 days.

(21) Appl. No.: 16/366,699

(22) Filed: Mar. 27, 2019

(65) Prior Publication Data

US 2019/0221689 A1 Jul. 18, 2019

Related U.S. Application Data

(63) Continuation of application No. PCT/CN2016/100627, filed on Sep. 28, 2016.

(51) Int. Cl.
| | | |
|---|---|---|
| *H01L 31/0224* | (2006.01) | |
| *H01B 1/04* | (2006.01) | |
| *H01B 5/14* | (2006.01) | |
| *C23C 16/26* | (2006.01) | |
| *C23C 14/18* | (2006.01) | |

(Continued)

(52) U.S. Cl.
CPC ...... *H01L 31/022466* (2013.01); *C23C 14/18* (2013.01); *C23C 14/30* (2013.01); *C23C 16/26* (2013.01); *H01B 1/04* (2013.01); *H01B 5/14* (2013.01); *H01L 31/18* (2013.01); *H01L 31/1884* (2013.01); *Y02P 70/50* (2015.11)

(58) Field of Classification Search
CPC ......... H01B 1/04; H01B 5/14; H01L 51/5215; H01L 31/022466; H01L 31/1884; H01L 51/442; C23C 14/18
USPC .......................... 428/142, 634; 136/255, 263
See application file for complete search history.

(56) References Cited

U.S. PATENT DOCUMENTS

| | | | |
|---|---|---|---|
| 8,981,357 B2 | 3/2015 | Yoon et al. | |
| 2007/0284557 A1 | 12/2007 | Gruner et al. | |

(Continued)

FOREIGN PATENT DOCUMENTS

| | | |
|---|---|---|
| CN | 102169963 A | 8/2011 |
| CN | 102437207 A | 5/2012 |

(Continued)

OTHER PUBLICATIONS

Suganuma "Fabrication of Transparent and Flexible Organic Field-Effect Transistors with Solution-Processed Graphene Source-Drain and Gate Electrodes." 2011 Appl. Phys. Express 4 021603 (Year: 2011).*

Lee "Chemically Modulated Band Gap in biilayer Graphene Memory Transistors with High On/Off Ratio." ACSNano vol. 9, No. 9, pp. 9034-9042. (Year: 2015).*

(Continued)

*Primary Examiner* — Tri V Nguyen

(74) *Attorney, Agent, or Firm* — Conley Rose, P.C.

(57) ABSTRACT

A transparent electrode is provided having a graphene conducting layer disposed above a substrate, a field effect control layer formed by using a transparent material, and a dielectric layer disposed between the graphene conducting layer and the field effect control layer, wherein the field effect control layer has a polarity charge in a working state. A sheet resistance of the transparent electrode is reduced.

17 Claims, 12 Drawing Sheets

(51) Int. Cl.
*C23C 14/30* (2006.01)
*H01L 31/18* (2006.01)

(56) References Cited

U.S. PATENT DOCUMENTS

| | | | |
|---|---|---|---|
| 2010/0237336 A1* | 9/2010 | Rinzler | H01L 51/102 257/40 |
| 2012/0098028 A1 | 4/2012 | Naito | |
| 2014/0235123 A1 | 8/2014 | Lin et al. | |
| 2014/0264282 A1* | 9/2014 | Lee | H01L 29/1606 257/29 |
| 2015/0311363 A1 | 10/2015 | Park et al. | |
| 2017/0125713 A1 | 5/2017 | Tokuda et al. | |

FOREIGN PATENT DOCUMENTS

| | | | |
|---|---|---|---|
| CN | 102456753 A | 5/2012 | |
| CN | 202996318 U | 6/2013 | |
| CN | 104409177 A | 3/2015 | |
| CN | 104576787 A | 4/2015 | |
| CN | 204303857 U | 4/2015 | |
| CN | 104781305 A | 7/2015 | |
| CN | 104851935 A | 8/2015 | |
| WO | 2015152425 A1 | 10/2015 | |
| WO | WO-2015166006 A1 * | 11/2015 | H01L 51/56 |
| WO | WO-2015166066 A1 * | 11/2015 | B23C 5/18 |

OTHER PUBLICATIONS

Choi "Controlled charge trapping by molybdenum disulphide and graphene in ultrathin heterostructured memory devices." Nature Comm,, 4, article 1624. (Year: 2013).*
Machine Translation and Abstract of Chinese Publication No. CN102437207, May 2, 2012, 14 pages.
Machine Translation and Abstract of Chinese Publication No. CN104409177, Mar. 11, 2015, 14 pages.
Machine Translation and Abstract of Chinese Publication No. CN202996318, Jun. 12, 2013, 10 pages.
Foreign Communication From A Counterpart Application, Chinese Application No. 201680087299.6, Chinese Office Action dated Sep. 3, 2019, 13 pages.
Liu, Z., et al., "Direct Growth of Graphene/Hexagonal Boron Nitride Stacked Layers," Nano Lett, 2011, pp. 2032-2037.
Machine Translation and Abstract of Chinese Publication No. CN104576787, Apr. 29, 2015, 9 pages.
Machine Translation and Abstract of Chinese Publication No. CN104851935, Aug. 19, 2015, 9 pages.
Machine Translation and Abstract of Chinese Publication No. CN204303857, Apr. 29, 2015, 21 pages.
Foreign Communication From a Counterpart Application, PCT Application No. PCT/CN2016/100627, English Translation of International Search Report dated Jun. 30, 2017, 2 pages.
Foreign Communication From a Counterpart Application, PCT Application No. PCT/CN2016/100627, English Translation of Written Opinion dated Jun. 30, 2017, 4 pages.

* cited by examiner

TRANSPARENT ELECTRODE, TRANSPARENT ELECTRODE PRODUCTION METHOD, DISPLAY PANEL, AND SOLAR CELL

CROSS-REFERENCE TO RELATED APPLICATIONS

This application is a continuation of International Application No. PCT/CN2016/100627 filed on Sep. 28, 2016, which is hereby incorporated by reference in their entireties.

TECHNICAL FIELD

The present application relates to the field of optoelectronic functional component technologies, and in particular, to a transparent electrode, a transparent electrode production method, a display panel, and a solar cell.

BACKGROUND

A transparent electrode is an indispensable component of products such as a display panel and a solar cell. A conventional transparent electrode mainly uses ITO (indium tin oxide) glass, to be specific, the glass is used as a substrate, and an ITO conductive film is coated on a surface of the glass. With continuous development of the display panel and the solar cell, a higher requirement for a sheet resistance, flexibility performance, and the like of the transparent electrode is imposed. A sheet resistance of a conventional ITO film is 150 to 400Ω/□, and the sheet resistance is inversely proportional to a thickness of the film. In other words, to reduce the sheet resistance of the ITO film, the thickness of the ITO film needs to be increased. However, thickening the film reduces transparency. In addition, the ITO is fragile and has poor flexibility. Moreover, indium storage in the ITO is limited, and will continuously decrease if indium resources are overused. It can be learned that the ITO cannot meet the requirements, and a new transparent electrode material needs to be developed.

Currently, in an existing transparent electrode using graphene as a conducting layer, a graphene conducting film is formed on a transparent substrate mainly by using a chemical vapor deposition method or a spin-coating method. The graphene is an emerging two-dimensional material, includes only one carbon atomic layer, and has high carrier mobility and good flexibility. In addition, a light transmittance of single-layer graphene is 97.7%. Therefore, the transparent electrode using the graphene as the conducting layer has advantages of both high transparency and flexibility.

In a process of implementing the present disclosure, the inventor finds that the prior art has at least the following problems: A sheet resistance of a graphene film is relatively high. A sheet resistance of the single-layer graphene grown by using the chemical vapor deposition method is usually greater than 300Ω/□, and a sheet resistance of a graphene film formed by using the spin-coating method may even reach 50000Ω/□. Although a sheet resistance of the graphene can be reduced by thickening the graphene film, transparency is also reduced. In other words, the existing transparent electrode using the graphene as the conducting layer has not all characteristics of a small sheet resistance, high transparency, and good flexibility.

SUMMARY

Based on the foregoing description, to resolve a technical problem, embodiments of the present disclosure provide a transparent electrode, a transparent electrode production method, a display panel based on the transparent electrode, and a solar cell, to reduce a sheet resistance of a graphene conducting layer of the transparent electrode on the premise that performance such as transparency and flexibility of the transparent electrode using graphene as the conducting layer is ensured.

Specifically, the following technical solutions are included.

According to a first aspect, an embodiment of the present disclosure provides a transparent electrode, and the transparent electrode includes:

a substrate;

a graphene conducting layer disposed on the substrate, and a field effect control layer formed by using a transparent material; and a dielectric layer disposed between the graphene conducting layer and the field effect control layer; where the field effect control layer has a polarity charge in a working state.

This embodiment of the present disclosure provides the transparent electrode that uses a field effect to reduce the sheet resistance of the graphene conducting layer. The graphene conducting layer, the field effect control layer formed by using the transparent material, and the dielectric layer located between the graphene conducting layer and the field effect control layer are disposed on the transparent electrode. The field effect control layer has the polarity charge in the working state. The polarity charge attracts a carrier with an opposite charge in the graphene conducting layer. According to a principle of a graphene field effect, a carrier concentration in the graphene conducting layer is increased, thereby reducing a sheet resistance of the graphene conducting layer without affecting transparency and flexibility of the entire transparent electrode.

In a possible design, the field effect control layer has a polar positive charge in the working state. When the field effect control layer has the polar positive charge in the working state, more carriers can be induced from the graphene conducting layer according to the field effect principle, and this helps reduce the sheet resistance of the graphene conducting layer.

In another possible design, a specific implementation in which the field effect control layer has the polarity charge in the working state is as follows: A material of the field effect control layer is a transparent conducting material, and the transparent electrode further includes a first metal electrode that is in ohmic contact with the graphene conducting layer and a second metal electrode that is in ohmic contact with the field effect control layer. The first metal electrode is configured to connect to one electrode of an external voltage source, and the second metal electrode is configured to connect to the other electrode of the external voltage source.

In this implementation, the metal electrodes are disposed on the graphene conducting layer and the field effect control layer, the metal electrodes are connected to the electrodes of the external voltage source, and the field effect control layer has the polarity charge through an external electrical field, so that a carrier concentration in the graphene conducting layer is increased, and the sheet resistance of the graphene conducting layer is reduced.

In another possible design, the first metal electrode is configured to connect to a negative electrode of the external voltage source, and the second metal electrode is configured to connect to a positive electrode of the external voltage source. The second metal electrode disposed on the field effect control layer is connected to the positive electrode of the external voltage source, and the field effect control layer has the polar positive charge, so that the graphene conducting layer has a higher carrier concentration, and this helps reduce the sheet resistance of the graphene conducting layer.

In another possible design, the transparent conducting material may be selected from graphene, indium tin oxide, zinc oxide, a metal nanowire, or a conducting organic polymer.

In another possible design, materials of the first metal electrode and the second metal electrode may be selected from at least one of gold, titanium, nickel, copper, chromium, aluminum, platinum, palladium, and tungsten.

In another possible design, another specific implementation in which the field effect control layer has the polarity charge in the working state is as follows: A material of the field effect control layer is the transparent material having the polarity charge. Forming a field effect by using a polarity charge of the material increases the carrier concentration of the graphene conducting layer, and reduces the sheet resistance of the graphene conducting layer.

In another possible design, the transparent material having the polarity charge may be doped graphene.

Specifically, an impurity concentration in the doped graphene may be greater than $10^{10}/cm^2$. More specifically, the impurity concentration in the doped graphene may be $10^{12}/cm^2$ to $10^{14}/cm^2$.

In another possible design, the transparent electrode further includes a protection layer disposed on a side that is of the graphene conducting layer and that is away from the dielectric layer and a protection layer disposed on a side that is of the field effect control layer and that is away from the dielectric layer. The protection layers disposed outside the graphene conducting layer and the field effect control layer ensure stability of the graphene conducting layer and the field effect control layer.

In another possible design, materials of the dielectric layer and the protection layers may be selected from boron nitride.

In another possible design, thicknesses of the dielectric layer and the protection layers are less than 20 nanometers.

In another possible design, a thickness of the graphene conducting layer may be less than 10 nanometers.

In another possible design, a material of the substrate may be selected from glass, polyimide, polyethylene terephthalate, polyethylene naphthalate, polymethyl methacrylate, polycarbonate, or polyurethane.

According to a second aspect, an embodiment of the present disclosure provides a transparent electrode production method. The production method includes the following steps:

providing a substrate;

forming a first protection layer on the substrate;

forming a field effect control layer on the first protection layer, where a material of the field effect control layer is a transparent conducting material;

forming a second metal electrode that is in ohmic contact with the field effect control layer and that is configured to connect to one electrode of an external voltage source;

forming a dielectric layer on the field effect control layer;

forming a graphene conducting layer on the dielectric layer;

forming a first metal electrode that is in ohmic contact with the graphene conducting layer and that is configured to connect to the other electrode of the external voltage source; and forming a second protection layer on the graphene conducting layer.

The transparent electrode according to the production method includes, sequentially from bottom to top, the substrate, the first protection layer, the field effect control layer, the dielectric layer, the graphene conducting layer, and the second protection layer are sequentially included from bottom to top. The metal electrodes are disposed on the field effect control layer and the graphene conducting layer, and the metal electrodes of the field effect control layer and the graphene conducting layer are respectively connected to the electrodes of the external voltage source, so that the field effect control layer has a polarity charge. Therefore, a graphene field effect is used to increase a carrier concentration in the graphene conducting layer, and reduce a sheet resistance of the graphene conducting layer without affecting transparency and flexibility of the entire transparent electrode.

In a possible design, the first protection layer, the field effect control layer, the dielectric layer, the graphene conducting layer, and the second protection layer are formed by using a chemical vapor deposition direct-growth method or a chemical vapor deposition growth and transfer method; and the first metal electrode and the second metal electrode are formed through evaporation or sputtering.

According to a third aspect, an embodiment of the present disclosure provides a transparent electrode production method. The production method includes the following steps:

providing a substrate;

forming a first protection layer on the substrate;

forming a graphene conducting layer on the first protection layer;

forming a first metal electrode that is in ohmic contact with the graphene conducting layer and that is configured to connect to one electrode of an external voltage source;

forming a dielectric layer on the graphene conducting layer;

forming a field effect control layer on the dielectric layer, where a material of the field effect control layer is a transparent conducting material;

forming a second metal electrode that is in ohmic contact with the field effect control layer and that is configured to connect to the other electrode of the external voltage source; and forming a second protection layer on the field effect control layer.

The transparent electrode according to the production method includes, subsequently from bottom to top, the substrate, the first protection layer, the graphene conducting layer, the dielectric layer, the field effect control layer, and the second protection layer. The metal electrodes are disposed on the graphene conducting layer and the field effect control layer, and the metal electrodes of the graphene conducting layer and the field effect control layer are respectively connected to the electrodes of the external voltage source, so that the field effect control layer has a polarity charge. Therefore, a graphene field effect is used to increase a carrier concentration in the graphene conducting layer, and reduce a sheet resistance of the graphene conducting layer without affecting transparency and flexibility of the entire transparent electrode.

In a possible design, the first protection layer, the field effect control layer, the dielectric layer, the graphene conducting layer, and the second protection layer are formed by using a chemical vapor deposition direct-growth method or a chemical vapor deposition growth and transfer method; and the first metal electrode and the second metal electrode are formed through evaporation or sputtering.

According to a fourth aspect, an embodiment of the present disclosure provides a transparent electrode production method. The production method includes the following steps:

providing a substrate;

forming a first protection layer on the substrate;

forming a field effect control layer on the first protection layer, where a material of the field effect control layer is a transparent material having a polarity charge;

forming a dielectric layer on the field effect control layer;

forming a graphene conducting layer on the dielectric layer; and forming a second protection layer on the graphene conducting layer.

The transparent electrode according to the production method includes, sequentially from bottom to top, the substrate, the first protection layer, the field effect control layer, the dielectric layer, the graphene conducting layer, and the second protection layer. The field effect control layer is formed by using the material having the polarity charge. Therefore, a graphene field effect is used to increase a carrier concentration in the graphene conducting layer, and reduce a sheet resistance of the graphene conducting layer without affecting transparency and flexibility of the entire transparent electrode.

In a possible design, the material of the field effect control layer may be specifically doped graphene, and correspondingly, the forming a field effect control layer on the first protection layer specifically includes:

forming a graphene layer on the first protection layer, and doping the graphene layer, to form the field effect control layer.

In another possible design, the first protection layer, the graphene layer, the dielectric layer, the graphene conducting layer, and the second protection layer are formed by using a chemical vapor deposition direct-growth method or a chemical vapor deposition growth and transfer method.

According to a fifth aspect, an embodiment of the present disclosure provides a transparent electrode production method. The production method includes the following steps:

providing a substrate;

forming a first protection layer on the substrate;

forming a graphene conducting layer on the first protection layer;

forming a dielectric layer on the graphene conducting layer;

forming a field effect control layer on the dielectric layer, where a material of the field effect control layer is a transparent material having a polarity charge; and forming a second protection layer on the field effect control layer.

The transparent electrode according to the production method includes, sequentially from bottom to top, the substrate, the first protection layer, the graphene conducting layer, the dielectric layer, the field effect control layer, and the second protection layer. The field effect control layer is formed by using the material having the polarity charge. Therefore, a graphene field effect is used to increase a carrier concentration in the graphene conducting layer, and reduce a sheet resistance of the graphene conducting layer without affecting transparency and flexibility of the entire transparent electrode.

In a possible design, the material of the field effect control layer may be specifically doped graphene, and correspondingly, the forming a field effect control layer on the dielectric layer specifically includes:

forming a graphene layer on the dielectric layer, and doping the graphene layer, to form the field effect control layer.

In another possible design, the first protection layer, the graphene conducting layer, the dielectric layer, the graphene layer, and the second protection layer are formed by using a chemical vapor deposition direct-growth method or a chemical vapor deposition growth and transfer method.

According to a sixth aspect, an embodiment of the present disclosure provides a display device, and the display device includes the foregoing transparent electrode.

It may be understood that, because a graphene conducting layer in the transparent electrode has a relatively small sheet resistance, and has good transparency and flexibility, the display device using the transparent electrode has good performance.

According to a seventh aspect, an embodiment of the present disclosure provides a solar cell, and the solar cell includes the foregoing transparent electrode.

It may be understood that, because a graphene conducting layer in the transparent electrode has a relatively small sheet resistance, and has good transparency and flexibility, the solar cell using the transparent electrode has good performance.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 1-2 is a schematic structural diagram of another transparent electrode according to an embodiment of the present disclosure;

FIG. 1-3 is a schematic structural diagram of still another transparent electrode according to an embodiment of the present disclosure;

FIG. 1-4 is a schematic structural diagram of still another transparent electrode according to an embodiment of the present disclosure;

FIG. 2-1 is a flowchart of a transparent electrode production method according to an embodiment of the present disclosure;

FIG. 2-2 is a schematic structural diagram of a transparent electrode that is completed step by step according to the transparent electrode production method shown in FIG. 2-1;

FIG. 3-1 is a flowchart of another transparent electrode production method according to an embodiment of the present disclosure;

FIG. 3-2 is a schematic structural diagram of a transparent electrode that is completed step by step according to the transparent electrode production method shown in FIG. 3-1;

FIG. 4-1 is a flowchart of still another transparent electrode production method according to an embodiment of the present disclosure;

FIG. 4-2 is a schematic structural diagram of a transparent electrode that is completed step by step according to the transparent electrode production method shown in FIG. 4-1;

FIG. 5-1 is a flowchart of still another transparent electrode production method according to an embodiment of the present disclosure;

FIG. 5-2 is a schematic structural diagram of a transparent electrode that is completed step by step according to the transparent electrode production method shown in FIG. 5-1;

FIG. 6-1 is a schematic structural diagram of a transparent electrode using graphene as a field effect control layer and using boron nitride as a dielectric layer and a protection layer according to an embodiment of the present disclosure;

FIG. 6-2 is a schematic structural diagram of another transparent electrode using graphene as a field effect control layer and using boron nitride as a dielectric layer and a protection layer according to an embodiment of the present disclosure;

FIG. 6-3 is a schematic structural diagram of a transparent electrode using doped graphene as a field effect control layer and using boron nitride as a dielectric layer and a protection layer according to an embodiment of the present disclosure; and FIG. 6-4 is a schematic structural diagram of another transparent electrode using doped graphene as a field effect control layer and using boron nitride as a dielectric layer and a protection layer according to an embodiment of the present disclosure.

Figure 1:
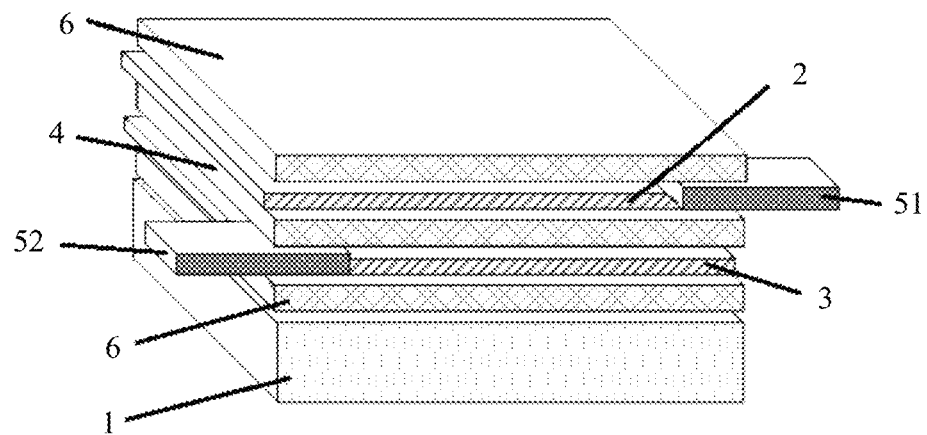
FIG. 1-1 is a schematic structural diagram of a transparent electrode according to an embodiment of the present disclosure.

Reference signs in the accompanying drawings respectively indicate:

1—substrate;
2—graphene conducting layer;
3—field effect control layer;
4—dielectric layer;
51—first metal electrode;
52—second metal electrode;
6—protection layer;
61—first protection layer; and
62—second protection layer.

DETAILED DESCRIPTION

To make the technical solutions, and advantages of the present disclosure clearer, the following further describes the implementations of the present disclosure in detail with reference to the accompanying drawings. Unless otherwise defined, all technical terms used in the embodiments of the present disclosure have a same meaning as generally understood by a person skilled in the art.

According to a first aspect, an embodiment of the present disclosure provides a transparent electrode. Referring to FIG. 1-1, FIG. 1-2, FIG. 1-3, or FIG. 1-4, the transparent electrode includes:

a substrate 1;

a graphene conducting layer 2 disposed on the substrate 1, and a field effect control layer 3 formed by using a transparent material; and a dielectric layer 4 disposed between the graphene conducting layer 2 and the field effect control layer 3.

The field effect control layer 3 has a polarity charge in a working state.

For graphene, a field effect may increase a carrier concentration in the graphene. Increasing the carrier concentration may reduce a resistance of the graphene. Based on this, this embodiment of the present disclosure provides a transparent electrode that uses the field effect to reduce a sheet resistance of the graphene conducting layer. The graphene conducting layer 2 formed by using the graphene, the field effect control layer 3 formed by using the transparent material, and the dielectric layer 4 located between the graphene conducting layer and the field effect control layer are disposed on the transparent electrode. The field effect control layer 3 has the polarity charge in the working state. The polarity charge attracts a carrier with an opposite charge in the graphene conducting layer 2. According to a principle of a graphene field effect, a carrier concentration in the graphene conducting layer 2 is increased, thereby reducing a sheet resistance of the graphene conducting layer 2 without affecting transparency and flexibility of the entire transparent electrode.

In the transparent electrode provided in this embodiment of the present disclosure, the graphene conducting layer 2 is equivalent to a conducting layer in an existing transparent electrode. When the transparent electrode provided in this embodiment of the present disclosure is applied to an optoelectronic functional component such as a display device or a solar cell, according to an existing transparent electrode use method, a corresponding metal electrode is disposed and a conducting wire is installed on the graphene conducting layer 2, so that the transparent electrode provided in this embodiment of the present disclosure is connected to an external circuit.

It should be noted that, the field effect control layer 3 in this embodiment of the present disclosure has the polarity charge in the working state, to be specific, the transparent electrode is applied to the display device, the solar cell, or another optoelectronic functional component, and when the optoelectronic functional component is in the working state, the field effect control layer 3 has the polarity charge. In addition, having the polarity charge means that a part of or the entire field effect control layer 3 is in a non-electrically-neutral state.

Figures 1, 2:
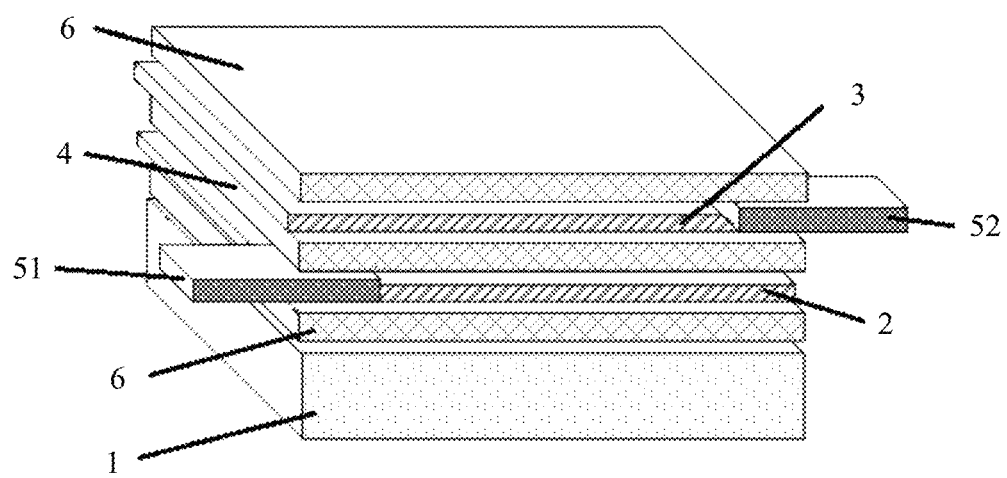
Figures 1, 2, 3:
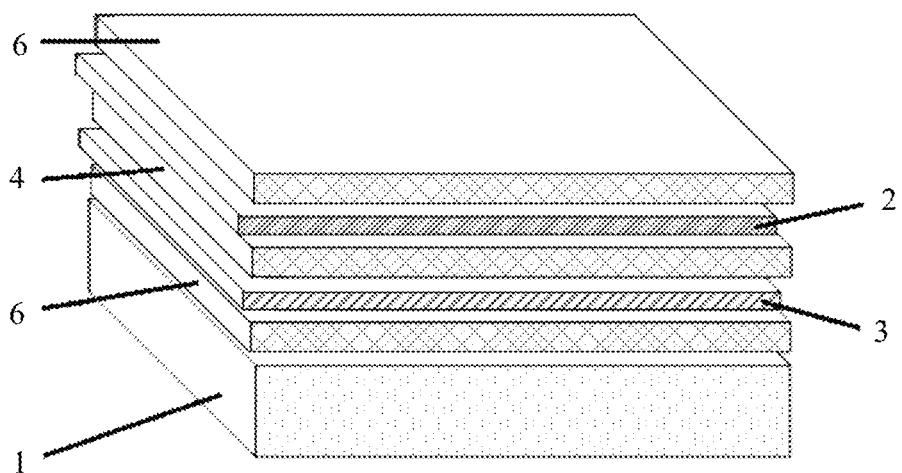

In this embodiment of the present disclosure, a position relationship between the substrate 1 and each of the graphene conducting layer 2 and the field effect control layer 3 is not strictly limited. As shown in FIG. 1-1 or FIG. 1-3, the field effect control layer 3 may be located below the graphene conducting layer 2. Alternatively, as shown in FIG. 1-2 or FIG. 1-4, the field effect control layer 3 may be located above the graphene conducting layer 2.

In an optional implementation of this embodiment of the present disclosure, the field effect control layer 3 has a polar positive charge in the working state. The carrier includes a positively-charged electron hole and a negatively-charged electron. According to a field effect principle, when the field effect control layer 3 has a polar positive charge, an electron in the graphene conducting layer 2 is attracted, and an electron concentration in the graphene conducting layer 2 is increased. When the field effect control layer 3 has a polar negative charge, an electron hole in the graphene conducting layer 2 is attracted, and an electron hole concentration in the graphene conducting layer 2 is increased. Because there is a large quantity of electrons in the graphene, when the field effect control layer 3 has the polar positive charge, the carrier concentration in the graphene conducting layer 2 is increased, and this helps reduce the sheet resistance of the graphene conducting layer 2.

FIG. 1-1 or FIG. 1-2 shows a specific implementation in which the field effect control layer 3 has the polarity charge in the working state.

Specifically, in this implementation, a material of the field effect control layer 3 is a transparent conducting material. The transparent electrode further includes a first metal electrode 51 that is in ohmic contact with the graphene conducting layer 2 and a second metal electrode 52 that is in ohmic contact with the field effect control layer 3. The first metal electrode 51 is configured to connect to one electrode of an external voltage source, and the second metal electrode 52 is configured to connect to the other electrode of the external voltage source.

The metal electrodes disposed on the graphene conducting layer 2 and the field effect control layer 3 are connected to the electrodes of the external voltage source, and the field effect control layer has the polarity charge through an external electrical field, so that the carrier concentration in the graphene conducting layer is increased, and the sheet resistance of the graphene conducting layer is reduced.

The external voltage source may include a positive electrode and a negative electrode. The second metal electrode 52 of the field effect control layer 3 may be connected to the positive electrode of the external voltage source, or may be connected to the negative electrode of the external voltage source. When the second metal electrode 52 is connected to the positive electrode of the external voltage source, the field effect control layer 3 has the polar positive charge. When the second metal electrode 52 is connected to the negative electrode of the external voltage source, the field effect control layer 3 has the polar negative charge. Based on the foregoing description, when the second metal electrode 52 is connected to the positive electrode of the external voltage source, and the first metal electrode 51 is connected to the negative electrode of the external voltage source, the carrier concentration in the graphene conducting layer 2 is increased, and this helps reduce the sheet resistance of the graphene conducting layer 2.

A voltage value of the external voltage source is not strictly limited, and a person skilled in the art may set the voltage value based on an actual requirement. The sheet resistance of the graphene conducting layer 2 decreases as the voltage value of the external voltage source increases. For example, when mobility of the graphene conducting layer 2 is 8000 $cm^2V^{-1}s^{-1}$, the sheet resistance is 300Ω/□. When the voltage value of the external voltage source is 1 V, the sheet resistance of the graphene conducting layer 2 is decreased to 60Ω/□. It should be noted that the voltage value of the external voltage source should not be excessively high. If the voltage value of the external voltage source is excessively high, the dielectric layer 4 between the graphene conducting layer 2 and the field effect control layer 3 is broken down, consequently affecting normal working of the transparent electrode. In this embodiment of the present disclosure, an external voltage source with adjustable voltage value may be used to adjust, in real time and based on an actual case, the sheet resistance of the graphene conducting layer 2.

In this embodiment of the present disclosure, the first metal electrode 51 of the graphene conducting layer 2 and the second metal electrode 52 of the field effect control layer 3 may be connected to the external voltage source only when the transparent electrode is in the working state. The first metal electrode 51 of the graphene conducting layer 2 and the second metal electrode 52 of the field effect control layer 3 are disconnected from the external voltage source when the transparent electrode is in a non-working state.

It should be noted that the first metal electrode 51 disposed on the graphene conducting layer 2 is independent of an electrode that is configured to connect to an external circuit and that is of the graphene conducting layer 2 in the transparent electrode in actual application.

In this implementation, a specific type of a transparent conducting material used to form the field effect control layer 3 is not strictly limited, and includes but is not limited to graphene, indium tin oxide, zinc oxide, a metal nanowire, or a conducting organic polymer. The metal nanowire may be a silver nanowire, and the conducting organic polymer may be a polyaniline-type transparent conducting polymer, a polythiophene-type transparent conducting polymer, or the like.

A material of the first metal electrode 51 and a material of the second metal electrode 52 are metal electrode materials commonly used in the art. This is not specifically limited in this embodiment of the present disclosure. For example, the material may be gold, titanium, nickel, copper, chromium, aluminum, platinum, palladium, or tungsten. One metal may be used as the material, or a combination of metals may be used as the material. For a specific manner of disposing the metal electrodes on the graphene conducting layer 2 and the field effect control layer 3, a common technical means in the art is used, and details are not described herein. It may be understood that the first metal electrode 51 and the second metal electrode 52 are connected to the external voltage source through a conducting wire.

FIG. 1-3 or FIG. 1-4 shows another specific implementation in which the field effect control layer 3 has the polarity charge in the working state.

In this implementation, the field effect control layer 3 is formed by using the transparent material having the polarity charge, and a field effect is formed by using a polarity charge of the material, so as to increase the carrier concentration in the graphene conducting layer 2, and reduce the sheet resistance of the graphene conducting layer 2.

If the field effect control layer 3 is formed by using a material having a polar positive charge, a concentration of a negatively-charged electron in the graphene conducting layer 2 is increased. If the field effect control layer 3 is formed by using a material having a polar negative charge, a concentration of a positively-charged electron hole in the graphene conducting layer 2 is increased. Because there is a large quantity of electrons in the graphene, when the field effect control layer 3 is formed by using the material having the polar positive charge, the carrier concentration in the graphene conducting layer 2 is increased, and this helps reduce the sheet resistance of the graphene conducting layer 2. It should be noted that in this implementation, the material of the field effect control layer 3 may be conductive or non-conductive provided that the material of the field effect control layer 3 is transparent and has the polarity charge.

The foregoing transparent material, having the polarity charge, used to form the field effect control layer 3 may be doped graphene, and the field effect is formed by using a impunity in the doped graphene and a charge center, so as to reduce the sheet resistance of the graphene conducting layer 2.

Specifically, in this embodiment of the present disclosure, an impurity concentration in the doped graphene may be greater than $10^{10}/cm^2$, for example, may be $10^{11}/cm^2$, $10^{12}/cm^2$, $10^{13}/cm^2$, $10^{14}/cm^2$, or $10^{15}/cm^2$, and more specifically, may be $10^{12}/cm^2$ to $10^{13}/cm^2$. The sheet resistance of the graphene conducting layer 2 decreases as the impurity concentration in the doped graphene increases. A person skilled in the art may determine the impurity concentration in the doped graphene based on an actual requirement. If the impurity concentration in the doped graphene is excessively low, the field effect cannot be formed, and the sheet resistance of the graphene conducting layer 2 cannot be reduced. If the impurity concentration in the doped graphene is excessively high, a relatively high requirement is imposed on a doping process.

A specific type of an impurity in the doped graphene is not specifically limited in this embodiment of the present disclosure. According to the foregoing description, when the doped graphene has a polar positive charge, the sheet resistance of the graphene conducting layer 2 is easily reduced.

Due to a limitation of the doping process, when the doped graphene is used as the field effect control layer 3, even distribution of the polarity charge in the field effect control layer 3 cannot be ensured, but it needs to be ensured that at least an edge of a side that is of the field effect control layer 3 and that is close to the dielectric layer 4 has the polarity charge.

Although the doped graphene has a relatively low sheet resistance, and the doped graphene has already been directly used as a conducting layer of the transparent electrode in the prior art, a current doping process of the graphene is immature. Therefore, it is difficult to ensure even doping, and overall performance of the transparent electrode is affected. However, in this embodiment of the present disclosure, the doped graphene is used as the field effect control layer 3, so that a requirement for the doping process may be appropriately reduced, and production difficulty of the doped graphene is reduced.

Further, to ensure stability of the graphene conducting layer 2 and the field effect control layer 3, and prevent water and oxygen in the air from affecting the graphene conducting layer 2 and the field effect control layer 3, in the transparent electrode provided in this embodiment of the present disclosure, a protection layer 6 may be disposed on a side that is of the graphene conducting layer 2 and that is away from the dielectric layer 4 and also disposed on a side that is of the field effect control layer 3 and that is away from the dielectric layer 4.

For the transparent electrode shown in FIG. 1-1 or FIG. 1-3, the field effect control layer 3 is located below the graphene conducting layer 2, and the protection layer 6 is disposed between the field effect control layer 3 and the substrate 1 and also disposed above the graphene conducting layer 2. For the transparent electrode shown in FIG. 1-2 and FIG. 1-4, the field effect control layer 3 is located above the graphene conducting layer 2, and the protection layer 6 is disposed between the graphene conducting layer 2 and the substrate 1 and also disposed above the field effect control layer 3.

It will be understood that in this embodiment of the present disclosure, materials of the dielectric layer 4 and the protection layer 6 should be a transparent and insulated material. In an optional implementation, the dielectric layer 4 and the protection layer 6 use boron nitride. Like the graphene, the boron nitride is also a two-dimensional material, has characteristics of both high transparency and flexibility, and can form a relatively good interface with the graphene, so that the graphene conducting layer 2 can maintain relatively high mobility. The boron nitride is an ideal dielectric layer material, and can form a valid field effect, so as to help reduce the sheet resistance of the graphene conducting layer 2. The boron nitride may be specifically hexagonal boron nitride.

Thicknesses of the dielectric layer 4 and the protection layer 6 are not strictly limited in this embodiment of the present disclosure. However, when a process condition can be met, the thicknesses of the dielectric layer 4 and the protection layer 6 should be reduced as much as possible, so as to ensure transparency and flexibility of the transparent electrode. When the dielectric layer 4 and the protection layer 6 use the boron nitride, the thicknesses of the dielectric layer 4 and the protection layer 6 may be less than 20 nanometers, for example, may be 15 nanometers, 10 nanometers, or 5 nanometers.

In this embodiment of the present disclosure, a thickness of the graphene conducting layer 2 may be less than 10 nanometers, for example, may be 8 nanometers, 6 nanometers, 5 nanometers, 4 nanometers, 2 nanometers, or 1 nanometer.

When the graphene or the doped graphene is used as the field effect control layer 3, a thickness of the field effect control layer 3 may also be less than 10 nanometers, for example, may be 8 nanometers, 6 nanometers, 5 nanometers, 4 nanometers, 2 nanometers, or 1 nanometer.

Thicknesses of the dielectric layer 4, the protection layer 6, the graphene conducting layer 2, and the field effect control layer 3 may be further controlled by controlling a quantity of layers of the boron nitride and the graphene. Specifically, for the graphene, a light transmittance of single-layer graphene is 97.7%. Therefore, to ensure overall light transmittance of the transparent electrode, a quantity of layers of the graphene in the graphene conducting layer 2 or the field effect control layer 3 may be controlled to be less than 10. However, the boron nitride does not absorb visible light and has relatively high transparency, and a light transmittance of two-layer boron nitride to five-layer boron nitride can still reach 99%. Therefore, a quantity of layers of the boron nitride may be appropriately increased, and may be less than 20.

A person skilled in the art may understand that in this embodiment of the present disclosure, the material of the substrate is the transparent material, and includes but is not limited to glass, polyimide, polyethylene terephthalate, polyethylene naphthalate, polymethyl methacrylate, polycarbonate, or polyurethane.

According to a second aspect, an embodiment of the present disclosure provides a transparent electrode production method. Referring to FIG. 2-1 and FIG. 2-2, the production method includes the following steps.

Step 201: Provide a substrate 1.

Step 202: Form a first protection layer 61 on the substrate 1.

Step 203: Form a field effect control layer 3 on the first protection layer 61, where a material of the field effect control layer 3 is a transparent conducting material.

Step 204: Form a second metal electrode 52 that is in ohmic contact with the field effect control layer 3 and that is configured to connect to one electrode of an external voltage source.

Step 205: Form a dielectric layer 4 on the field effect control layer 3.

Step 206: Form a graphene conducting layer 2 on the dielectric layer 4.

Step 207: Form a first metal electrode 51 that is in ohmic contact with the graphene conducting layer 2 and that is configured to connect to the other electrode of the external voltage source.

Step 208: Form a second protection layer 62 on the graphene conducting layer 2.

The transparent electrode according to the production method provided in this embodiment of the present disclosure includes, sequentially from bottom to top, the substrate 1, the first protection layer 61, the field effect control layer 3, the dielectric layer 4, the graphene conducting layer 2, and the second protection layer 62. The metal electrodes are disposed on the field effect control layer 3 and the graphene conducting layer 2, and the metal electrodes of the field effect control layer 3 and the graphene conducting layer 2 are respectively connected to the electrodes of the external voltage source, so that the field effect control layer 3 has a polarity charge. Therefore, a graphene field effect is used to increase a carrier concentration in the graphene conducting layer 2, and reduce a sheet resistance of the graphene conducting layer 2 without affecting transparency and flexibility of the entire transparent electrode.

In the production method, the substrate 1 is a transparent material, and includes but is not limited to glass, polyimide, polyethylene terephthalate, polyethylene naphthalate, polymethyl methacrylate, polycarbonate, or polyurethane. Step 201 may specifically include: producing the substrate 1, cleaning the substrate 1, processing a surface, and the like, so as to help form the first protection layer 61 on the substrate 1.

In this production method, a transparent conducting material used to form the field effect control layer 3 includes but is not limited to graphene, indium tin oxide, zinc oxide, a metal nanowire, or a conducting organic polymer. For different materials, different specific methods are used to form the field effect control layer 3 on the first protection layer 61 in step 203. For example, when the graphene is used as the field effect control layer 3, the field effect control layer 3 may be formed by using a chemical vapor deposition (CVD) direct-growth method or a chemical vapor deposition growth and transfer method.

Materials of the first protection layer 61, the dielectric layer 4, and the second protection layer 62 may be the boron nitride. Correspondingly, the first protection layer 61, the dielectric layer 4, and the second protection layer 62 may be formed by using a chemical vapor deposition direct-growth method or a chemical vapor deposition growth and transfer method.

The graphene conducting layer 2 may also be formed by using a chemical vapor deposition direct-growth method or a chemical vapor deposition growth and transfer method.

Materials of the first metal electrode 51 and the second metal electrode 52 include but are not limited to gold, titanium, nickel, copper, chromium, aluminum, platinum, palladium, or tungsten. The first metal electrode 51 and the second metal electrode 52 may be formed through evaporation or sputtering. It may be understood that the first metal electrode 51 and the second metal electrode 52 are formed on the substrate 1, and a side that covers the first protection layer 61 and the field effect control layer 3 (or the dielectric layer 4 and the graphene conducting layer 2) is touching an upper surface of the field effect control layer 3 (or the graphene conducting layer 2), to form an ohmic contact.

The chemical vapor deposition direct-growth method, the chemical vapor deposition growth and transfer method, the evaporation method, and the sputtering method are conventional technical means in the art, and details are not described herein.

According to a third aspect, an embodiment of the present disclosure provides a transparent electrode production method. Referring to FIG. 3-1 and FIG. 3-2, the production method includes the following steps.

Step 301: Provide a substrate 1.

Step 302: Form a first protection layer 61 on the substrate 1.

Step 303: Form a graphene conducting layer 2 on the first protection layer 61.

Step 304: Form a first metal electrode 51 that is in ohmic contact with the graphene conducting layer 2 and that is configured to connect to one electrode of an external voltage source.

Step 305: Form a dielectric layer 4 on the graphene conducting layer 2.

Step 306: Form a field effect control layer 3 on the dielectric layer 4, where a material of the field effect control layer 3 is a transparent conducting material.

Step 307: Form a second metal electrode 52 that is in ohmic contact with the field effect control layer 3 and that is configured to connect to the other electrode of the external voltage source.

Step 308: Form a second protection layer 62 on the field effect control layer 3.

The transparent electrode according to the production method provided in this embodiment of the present disclosure includes, sequentially from bottom to top, the substrate 1, the first protection layer 61, the graphene conducting layer 2, the dielectric layer 4, the field effect control layer 3, and the second protection layer 62. The metal electrodes are disposed on the graphene conducting layer 2 and the field effect control layer 3, and the metal electrodes of the graphene conducting layer 2 and the field effect control layer 3 are respectively connected to the electrodes of the external voltage source, so that the field effect control layer 3 has a polarity charge. Therefore, a graphene field effect is used to increase a carrier concentration in the graphene conducting layer 2, and reduce a sheet resistance of the graphene conducting layer 2 without affecting transparency and flexibility of the entire transparent electrode.

For materials of the substrate 1, the first protection layer 61, the dielectric layer 4, the field effect control layer 3, and the second protection layer 62 in the production method, specific methods for forming the foregoing layers, and a specific method for forming the graphene conducting layer 2, refer to the description in the second aspect of the embodiments of the present disclosure. Details are not described herein again.

Figures 1, 2, 3, 4:
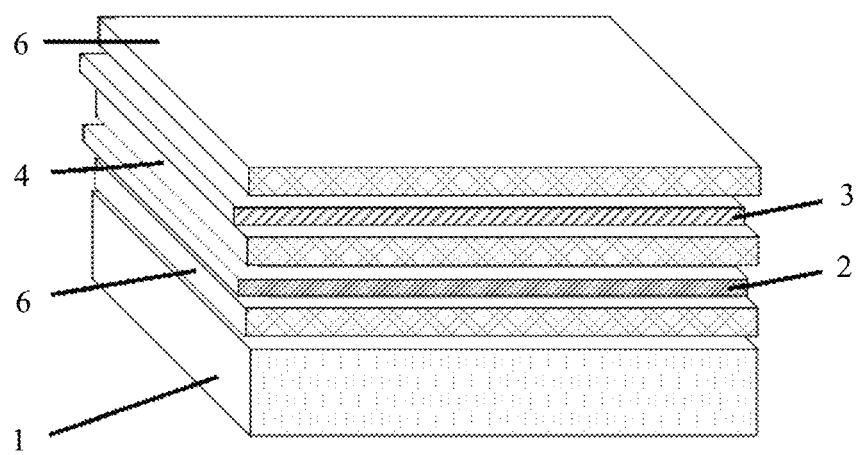
Figures 1, 2:
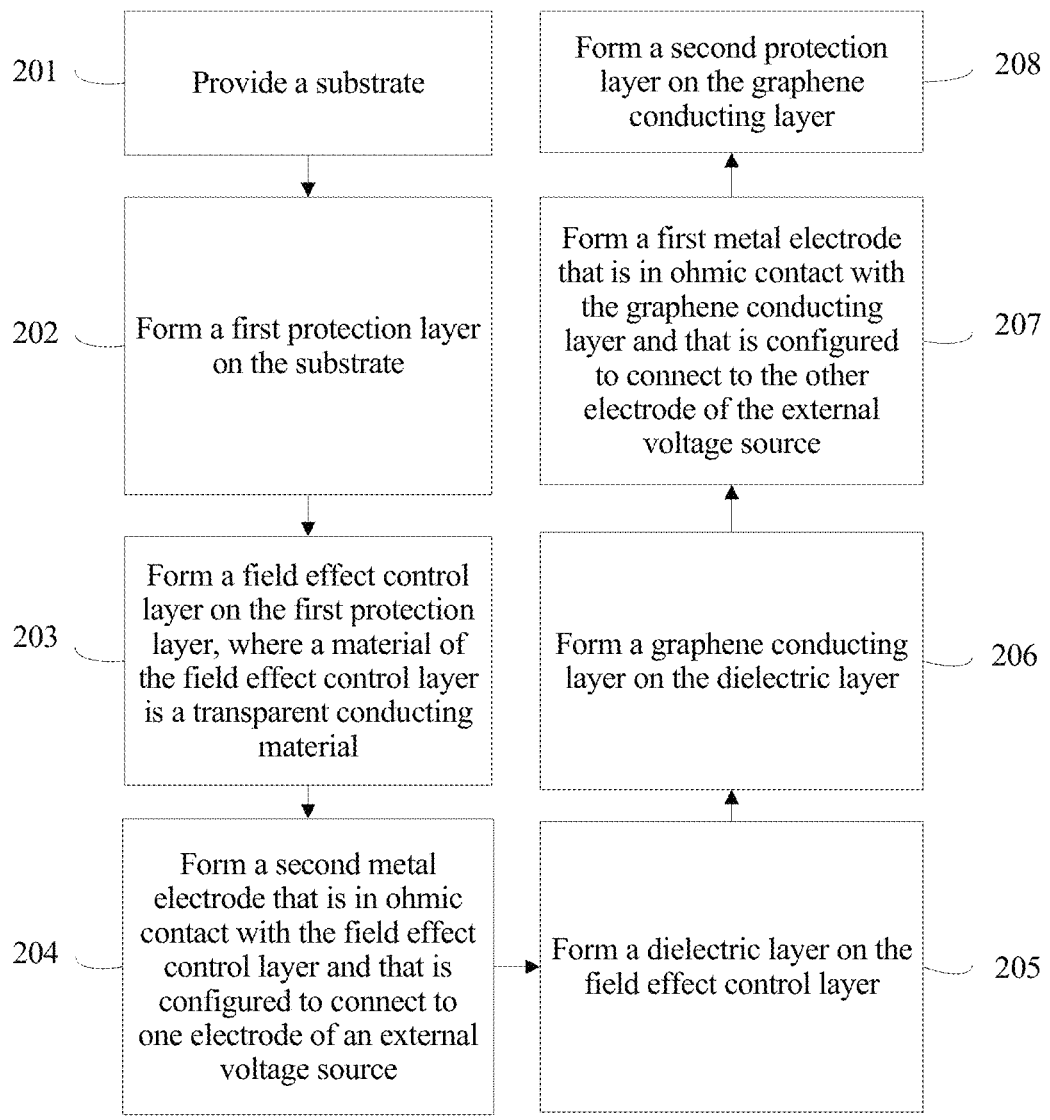
Figure 2:
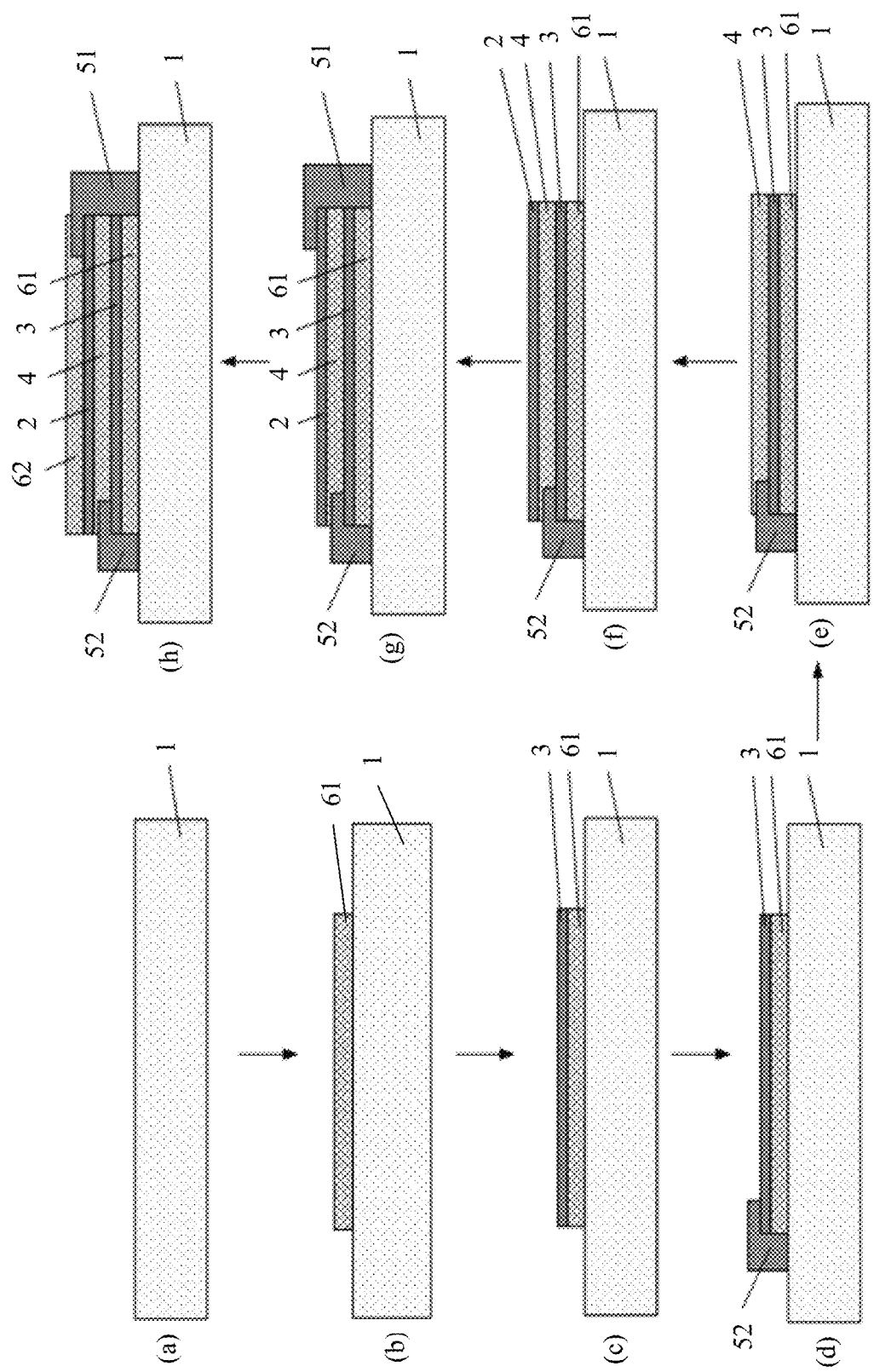
Figures 1, 3:
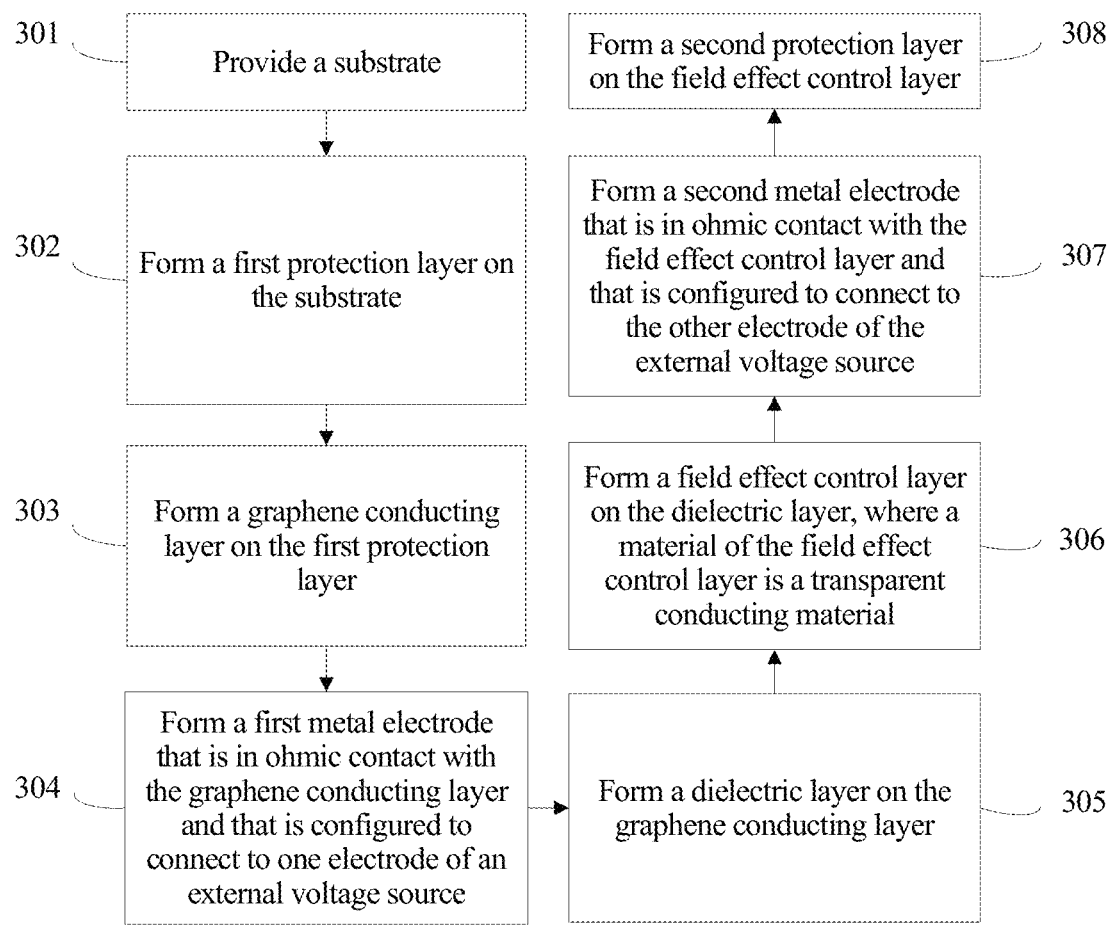
Figures 2, 3:
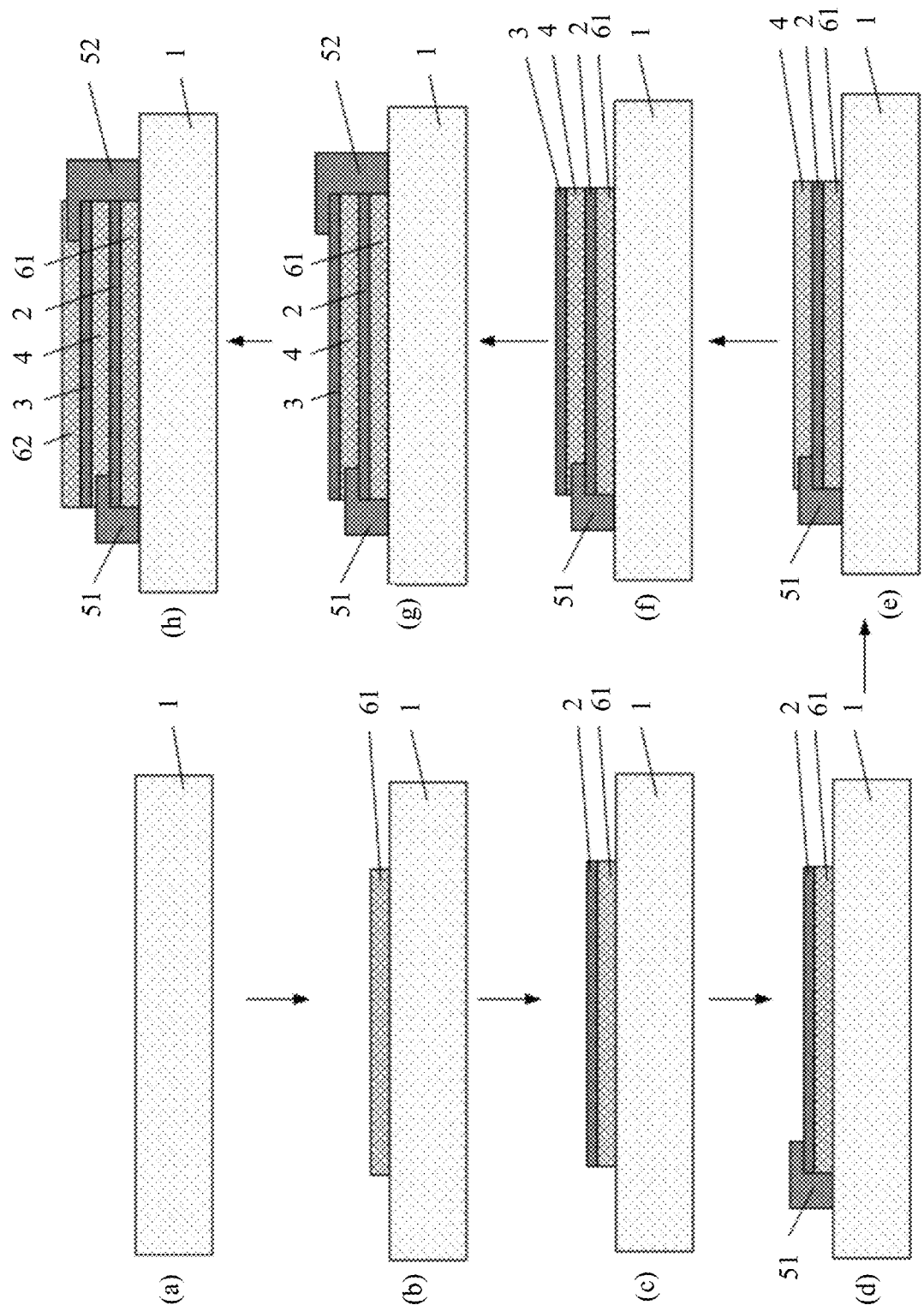
Figures 1, 4:
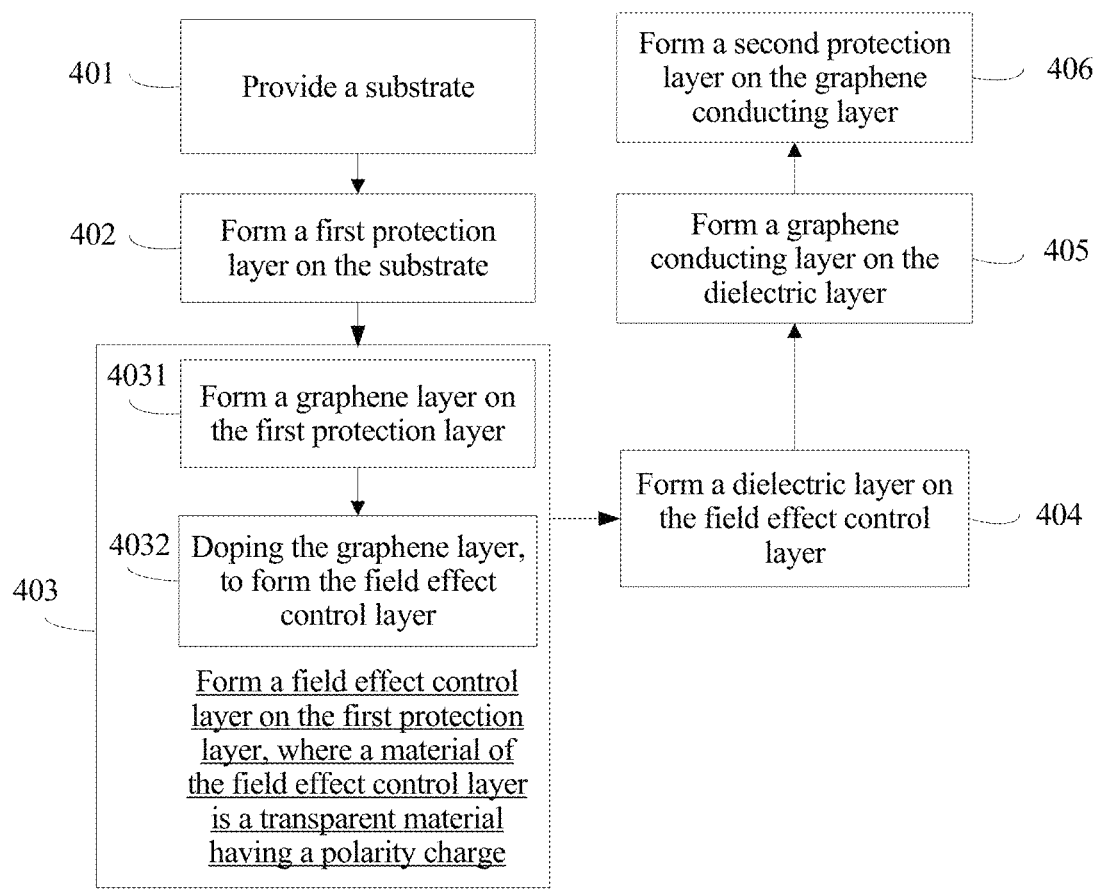
Figures 2, 4:
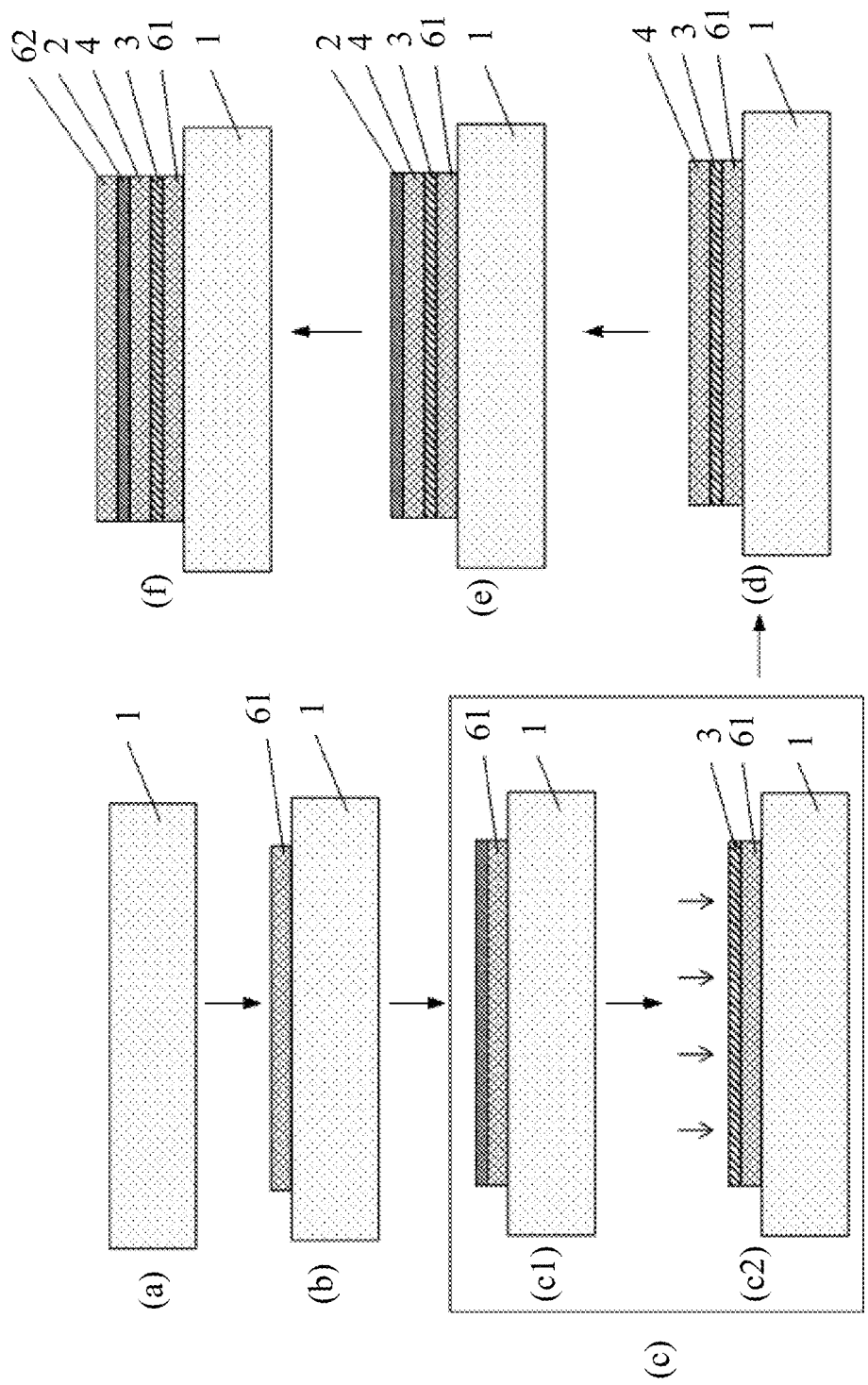

According to a fourth aspect, an embodiment of the present disclosure provides a transparent electrode production method. Referring to FIG. 4-1 and FIG. 4-2, the production method includes the following steps.

Step 401: Provide a substrate 1.

Step 402: Form a first protection layer 61 on the substrate 1.

Step 403: Form a field effect control layer 3 on the first protection layer 61, where a material of the field effect control layer 3 is a transparent material having a polarity charge.

Step 404: Form a dielectric layer 4 on the field effect control layer 3.

Step 405: Form a graphene conducting layer 2 on the dielectric layer 4.

Step 406: Form a second protection layer 62 on the graphene conducting layer 2.

The transparent electrode according to the production method provided in this embodiment of the present disclosure includes, sequentially from bottom to top, the substrate 1, the first protection layer 61, the field effect control layer 3, the dielectric layer 4, the graphene conducting layer 2, and the second protection layer 62. The field effect control layer is formed by using the material having the polarity charge. Therefore, a graphene field effect is used to increase a carrier concentration in the graphene conducting layer 2, and reduce a sheet resistance of the graphene conducting layer 2 without affecting transparency and flexibility of the entire transparent electrode.

Optionally, the material of the field effect control layer 3 uses doped graphene. For an implementation in which the field effect control layer 3 uses the doped graphene, refer to FIG. 4-1 and FIG. 4-2. In step 403, forming the field effect control layer 3 on the first protection layer 61 includes the following steps.

Step 4031: Form a graphene layer on the first protection layer 61.

Step 4032: Doping the graphene layer, to form the field effect control layer 3.

The graphene layer may be formed on the first protection layer 61 by using a chemical vapor deposition direct-growth method or a chemical vapor deposition growth and transfer method.

In the production method, materials of the first protection layer 61, the dielectric layer 4, and the second protection layer 62 may be boron nitride. Correspondingly, the first protection layer 61, the dielectric layer 4, and the second protection layer 62 may be formed by using the chemical vapor deposition direct-growth method or the chemical vapor deposition growth and transfer method.

The chemical vapor deposition direct-growth method, the chemical vapor deposition growth and transfer method, and the method for doping the graphene layer are conventional technical means in the art, and details are not described herein.

In addition, in the production method, the substrate 1 is a transparent material, and includes but is not limited to glass, polyimide, polyethylene terephthalate, polyethylene naphthalate, polymethyl methacrylate, polycarbonate, or polyurethane. Step 401 may specifically include: producing the substrate 1, cleaning the substrate 1, processing a surface, and the like, so as to help form the first protection layer 61 on the substrate 1.

Figures 1, 5:
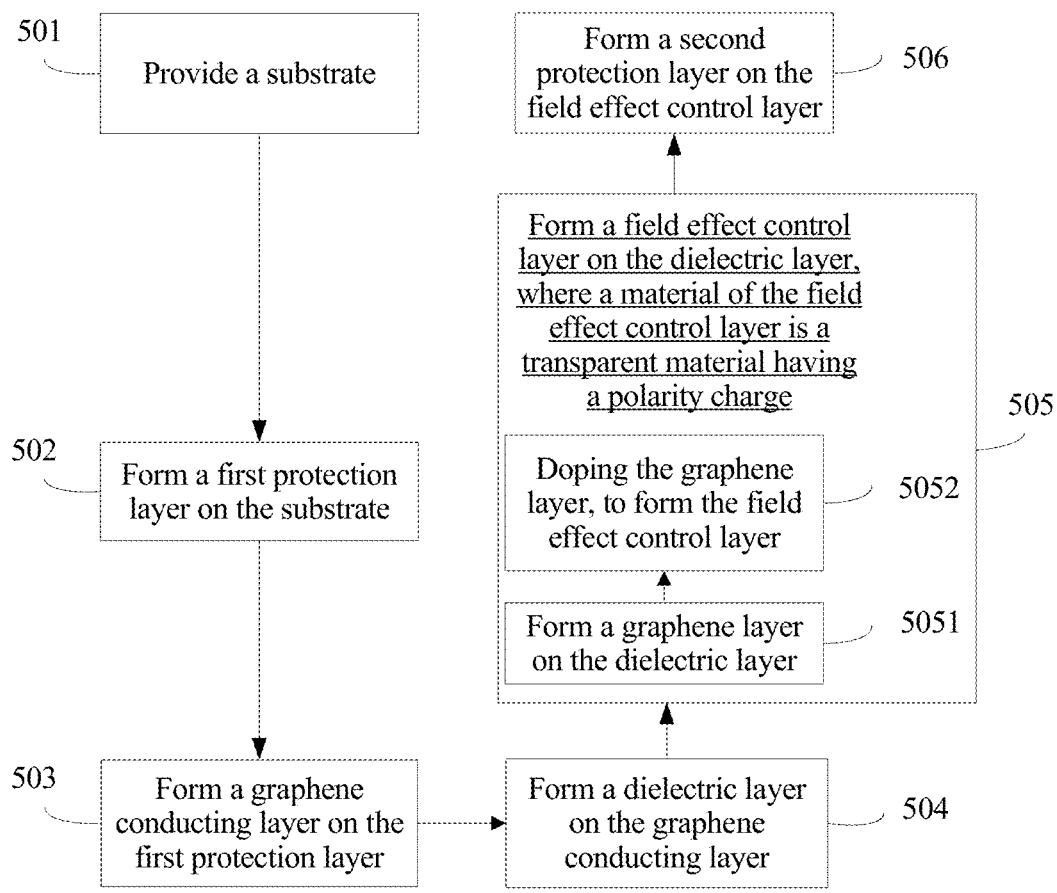
Figures 2, 5:
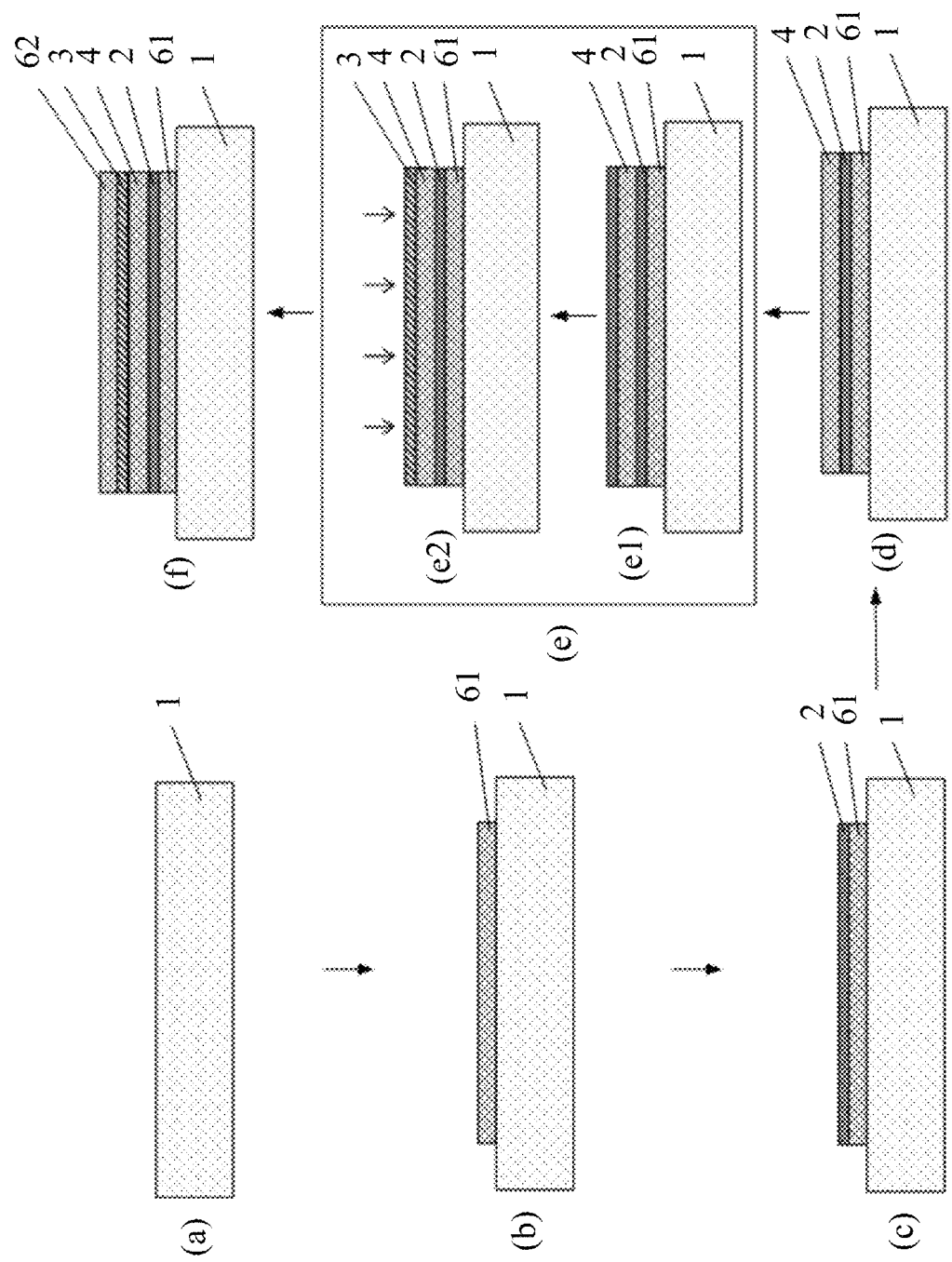

According to a fifth aspect, an embodiment of the present disclosure provides a transparent electrode production method. Referring to FIG. 5-1 and FIG. 5-2, the production method includes the following steps.

Step 501: Provide a substrate 1.

Step 502: Form a first protection layer 61 on the substrate 1.

Step 503: Form a graphene conducting layer 2 on the first protection layer 61.

Step 504: Form a dielectric layer 4 on the graphene conducting layer 2.

Step 505: Form a field effect control layer 3 on the dielectric layer 4, where a material of the field effect control layer 3 is a transparent material having a polarity charge.

Step 506: Form a second protection layer 62 on the field effect control layer 3.

The transparent electrode according to the production method includes, sequentially from bottom to top, the substrate 1, the first protection layer 61, the graphene conducting layer 2, the dielectric layer 4, the field effect control layer 3, and the second protection layer 62. The field effect control layer is formed by using the material having the polarity charge. Therefore, a graphene field effect is used to increase a carrier concentration in the graphene conducting layer 2, and reduce a sheet resistance of the graphene conducting layer 2 without affecting transparency and flexibility of the entire transparent electrode.

Similarly, the material of the field effect control layer 3 in the production method may also use doped graphene. For an implementation in which the field effect control layer 3 uses the doped graphene, refer to FIG. 5-1 and FIG. 5-2. In step 505, forming the field effect control layer 3 on the dielectric layer 4 includes the following steps.

Step S051: Form a graphene layer on the dielectric layer 4.

Step S052: Doping the graphene layer, to form the field effect control layer 3.

For materials of the substrate 1, the first protection layer 61, the dielectric layer 4, and the second protection layer 62 in the production method, specific methods for forming the foregoing layers, a specific method for forming the graphene conducting layer 2, a specific method for forming the graphene layer of the field effect control layer 3, and a specific method for doping the graphene layer, refer to the description in the fourth aspect of the embodiments of the present disclosure. Details are not described herein again.

According to a sixth aspect, an embodiment of the present disclosure provides a display device, and the display device includes the foregoing transparent electrode.

Because a graphene conducting layer in the transparent electrode provided in the embodiments of the present disclosure has a relatively small sheet resistance, and has good transparency and flexibility, the display device using the transparent electrode provided in the embodiments of the present disclosure has good performance.

When the transparent electrode provided in the embodiments of the present disclosure is applied to the display device, a corresponding metal electrode is disposed and a conducting wire is installed on the graphene conducting layer, so that the transparent electrode provided in the embodiments of the present disclosure is connected to a corresponding circuit.

For an implementation in which an external voltage source is used to reduce the graphene conducting layer, after the display device enters a working state, metal electrodes that are of the field effect control layer and the graphene conducting layer and that are configured to connect to the external voltage source are connected to the external voltage source, so that the sheet resistance of the graphene conducting layer is reduced.

In this embodiment of the present disclosure, the display device includes but is not limited to any product or component that has a display function, such as a mobile phone, a tablet computer, an electronic paper, a notebook computer screen, or a liquid crystal display television.

According to a seventh aspect, an embodiment of the present disclosure provides a solar cell, and the solar cell includes the foregoing transparent electrode.

Because a graphene conducting layer in the transparent electrode provided in the embodiments of the present disclosure has a relatively small sheet resistance, and has good transparency and flexibility, the solar cell using the transparent electrode provided in the embodiments of the present disclosure has good performance.

When the transparent electrode provided in the embodiments of the present disclosure is applied to the solar cell, a corresponding metal electrode is disposed and a conducting wire is installed on the graphene conducting layer, so that the transparent electrode provided in the embodiments of the present disclosure is connected to a corresponding circuit.

For an implementation in which an external voltage source is used to reduce the graphene conducting layer, after the solar cell enters a working state, metal electrodes that are of the field effect control layer and the graphene conducting layer and that are configured to connect to the external voltage source are connected to the external voltage source, so that the sheet resistance of the graphene conducting layer is reduced.

In this embodiment of the present disclosure, the solar cell may be any type of solar cell, and includes but is not limited to a silicon-based solar cell, a dye-sensitized solar cell, or an organic polymer solar cell.

The technical solutions in the embodiments of the present disclosure are further described in detail with reference to specific embodiments in the following.

Figures 1, 6:
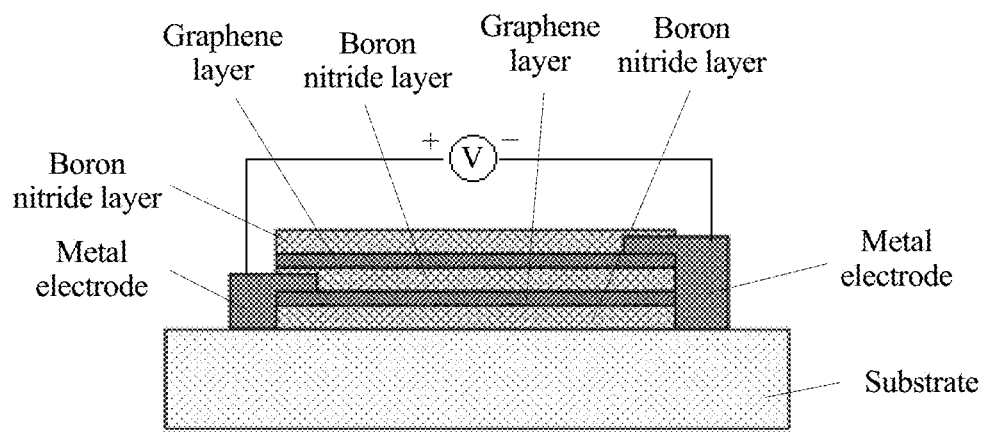
Figures 2, 6:
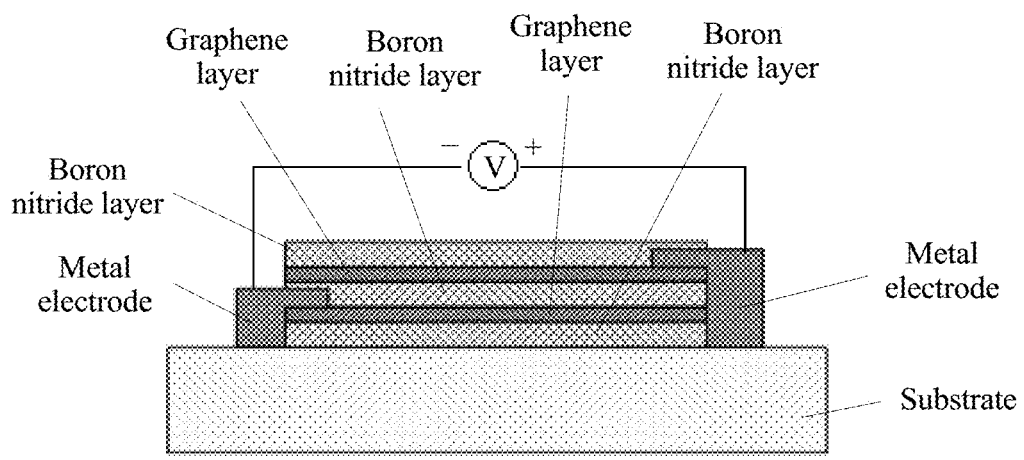
Figures 3, 6:
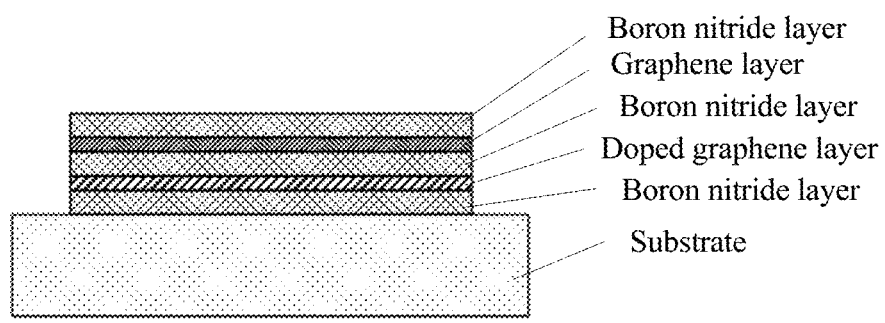
Figures 4, 6:
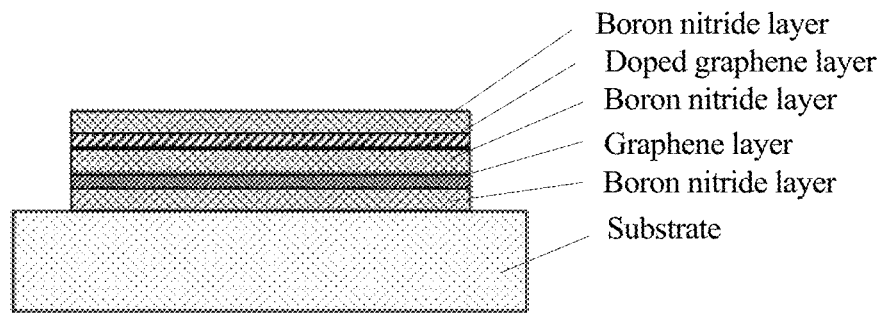

FIG. 6-1 is a schematic structural diagram of a transparent electrode using graphene as a field effect control layer and using boron nitride as a dielectric layer and a protection layer. Referring to FIG. 6-1, a substrate, a boron nitride layer, a graphene layer, a boron nitride layer, a graphene layer, and a boron nitride layer are sequentially disposed on the transparent electrode from bottom to top. A metal electrode is further disposed on each of the two graphene layers, and an ohmic contact is formed between the metal electrode and the graphene layer. The lower graphene layer is the field effect control layer, the upper graphene layer is a conducting layer, the boron nitride layer between the two graphene layers is the dielectric layer, and the boron nitride layer between the substrate and the lower graphene layer and the boron nitride layer above the upper graphene layer are protection layers. A thickness of each graphene layer is less than 10 nanometers, and a thickness of each boron nitride layer is less than 20 nanometers.

When the transparent electrode is in a working state, a metal electrode of the lower graphene layer is connected to a positive electrode of an external voltage source, and a metal electrode of the upper graphene layer is connected to a negative electrode of the external voltage source, so that the lower graphene layer has a polar positive charge, an electron concentration in the upper graphene layer is increased, and a sheet resistance of the upper graphene layer is reduced.

FIG. 6-2 is a schematic structural diagram of another transparent electrode using graphene as a field effect control layer and using boron nitride as a dielectric layer and a protection layer. Referring to FIG. 6-2, a substrate, a boron nitride layer, a graphene layer, a boron nitride layer, a graphene layer, and a boron nitride layer are sequentially disposed on the transparent electrode from bottom to top. A metal electrode is further disposed on each of the two graphene layers, and an ohmic contact is formed between the metal electrode and the graphene layer. The upper graphene layer is the field effect control layer, the lower graphene layer is a conducting layer, the boron nitride layer between the two graphene layers is the dielectric layer, and the boron nitride layer between the substrate and the lower graphene layer and the boron nitride layer above the upper graphene layer are protection layers. A thickness of each graphene layer is less than 10 nanometers, and a thickness of each boron nitride layer is less than 20 nanometers.

When the transparent electrode is in a working state, a metal electrode of the upper graphene layer is connected to a positive electrode of an external voltage source, and a metal electrode of the lower graphene layer is connected to a negative electrode of the external voltage source, so that the upper graphene layer has a polar positive charge, a field effect is formed, an electron concentration in the lower graphene layer is increased, and a sheet resistance of the lower graphene layer is reduced.

FIG. 6-3 is a schematic structural diagram of a transparent electrode using doped graphene as a field effect control layer and using boron nitride as a dielectric layer and a protection layer. Referring to FIG. 6-3, a substrate, a boron nitride layer, a doped graphene layer, a boron nitride layer, a graphene layer, and a boron nitride layer are sequentially disposed on the transparent electrode from bottom to top. The doped graphene layer is the field effect control layer, the graphene layer is a conducting layer, the boron nitride layer between the graphene layer and the doped graphene layer is the dielectric layer, and the boron nitride layer between the substrate and the doped graphene layer and the boron nitride layer above the graphene layer are protection layers. Thicknesses of the graphene layer and the doped graphene layer are less than 10 nanometers, and a thickness of each boron nitride layer is less than 20 nanometers.

In the transparent electrode, a field effect is formed by using a impunity in the doped graphene and a charge center, so that a carrier concentration in the graphene layer is increased, and a sheet resistance of the graphene layer is reduced.

FIG. 6-4 is a schematic structural diagram of another transparent electrode using doped graphene as a field effect control layer and using boron nitride as a dielectric layer and a protection layer. Referring to FIG. 6-4, a substrate, a boron nitride layer, a graphene layer, a boron nitride layer, a doped graphene layer, and a boron nitride layer are sequentially disposed on the transparent electrode from bottom to top. The doped graphene layer is the field effect control layer, the graphene layer is a conducting layer, the boron nitride layer between the graphene layer and the doped graphene layer is the dielectric layer, and the boron nitride layer between the substrate and the graphene layer and the boron nitride layer above the doped graphene layer are protection layers. Thicknesses of the graphene layer and the doped graphene layer are less than 10 nanometers, and a thickness of each boron nitride layer is less than 20 nanometers.

In the transparent electrode, a field effect is formed by using a disadvantage in the doped graphene and a charge center, so that a carrier concentration in the graphene layer is increased, and a sheet resistance of the graphene layer is reduced.

In the foregoing four transparent electrodes, when the sheet resistance of the graphene layer used as the conducting layer is reduced according to a field effect principle, because both the graphene and the boron nitride are two-dimensional materials, the foregoing transparent electrode further has good transparency and flexibility, and may be used for flexible display. Research indicates that when a single layer of graphene exists in the graphene layer or the doped graphene layer, and a quantity of layers of the boron nitride in a boron nitride layer is less than 10, a light transmittance of the transparent electrode can reach more than 90%. Further, a good interface is formed between the boron nitride layer and each of the graphene layer and the doped graphene layer, so that the graphene layer used as the conducting layer keeps relatively high carrier mobility. In addition, the graphene layer and the doped graphene layer are protected from external impact, facilitating industrial integration.

In conclusion, in the transparent electrode provided in the embodiments of the present disclosure, the field effect control layer has the polarity charge in the working state of the transparent electrode, so that the carrier concentration in the graphene conducting layer is increased according to the field effect principle, the sheet resistance of the graphene conducting layer is reduced without compromising transparency and flexibility of the transparent electrode, and this helps improve performance of an optoelectronic functional component such as a display device or a solar cell. In addition, the transparent electrode provided in the embodiments of the present disclosure is compatible with a conventional semiconductor planar process, and low-cost mass production is easily implemented.

The foregoing descriptions are merely intended to facilitate a person skilled in the art to understand the technical solutions of the present disclosure, and are not intended to limit the present disclosure. Any modification, equivalent replacement, or improvement made without departing from the spirit and principle of the present disclosure shall fall within the protection scope of the present disclosure.

What is claimed is:

1. A transparent electrode, comprising:
a substrate;
a graphene conducting layer disposed above the substrate;
a field effect control layer comprising a transparent material, wherein the field effect control layer has a polarity charge in a working state;
a dielectric layer disposed between the graphene conducting layer and the field effect control layer;
a first metal electrode in ohmic contact with the graphene conducting layer and configured to couple to a negative electrode of an external voltage source, wherein at least a first portion of the first metal electrode protrudes laterally from and away a first side edge of the graphene conducing layer; and
a second metal electrode in ohmic contact with the field effect control layer and configured to couple to a positive electrode of the external voltage source, wherein at least a second portion of the second metal electrode protrudes laterally from and away a second side edge of the field effect control layer,
wherein a carrier concentration in the graphene conducting layer is increased and a sheet resistance of the graphene conducting layer is reduced when the first metal electrode is connected to the negative electrode and the second metal electrode is connected to the positive electrode.

2. The transparent electrode of claim 1, wherein the field effect control layer has a polar positive charge in the working state such that at least a portion of the field effect control layer is in a non-electrically-neutral state.

3. The transparent electrode of claim 1, wherein the transparent material is a conducting material comprising at least one of graphene, indium tin oxide, zinc oxide, a metal nanowire, or a conducting organic polymer.

4. The transparent electrode of claim 1, wherein a sheet resistance of the graphene conducting layer decreases as a voltage value of the external voltage source increases, and wherein the first metal electrode and the second metal electrode comprise at least one of gold, titanium, nickel, copper, chromium, aluminum, platinum, palladium, or tungsten.

5. The transparent electrode of claim 1, wherein the transparent material of the field effect control layer has the polarity charge.

6. The transparent electrode of claim 5, wherein the transparent material having the polarity charge is doped graphene, and wherein the doped graphene is used as the field effect control layer of the transparent electrode.

7. The transparent electrode of claim 6, wherein an impurity concentration in the doped graphene is equal to or greater than $10^{10}$/centimeters cm$^2$.

8. The transparent electrode of claim 7, wherein the impurity concentration in the doped graphene is in a range of $10^{12}$/cm$^2$ to $10^{14}$/cm$^2$.

9. The transparent electrode of claim 1, further comprising:
a first protection layer disposed adjacent a side of the graphene conducting layer opposite the dielectric layer; and
a second protection layer disposed adjacent a side of the field effect control layer opposite the dielectric layer.

10. The transparent electrode of claim 9, wherein the dielectric layer, the first protection layer, and the second protection layer each comprise boron nitride.

11. The transparent electrode of claim 10, wherein the dielectric layer, the first protection layer, and the second protection layer each have a thickness less than 20 nanometers.

12. The transparent electrode of claim 1, wherein a thickness of the graphene conducting layer is less than 10 nanometers.

13. The transparent electrode of claim 1, wherein the substrate comprises glass, polyimide, polyethylene terephthalate, polyethylene naphthalate, polymethyl methacrylate, polycarbonate, or polyurethane.

14. A transparent electrode, comprising:
a substrate;
a graphene conducting layer disposed above the substrate;
a field effect control layer comprising a transparent material, wherein the field effect control layer has a polarity charge in a working state, and wherein the polarity charge attracts a carrier with an opposite charge in the graphene conducting layer;
a dielectric layer disposed between the graphene conducting layer and the field effect control layer;
a first metal electrode in ohmic contact with the graphene conducting layer and configured to couple to a negative electrode of an external voltage source, wherein at least a first portion of the first metal electrode protrudes laterally from and away a first side edge of the graphene conducting layer; and
a second metal electrode in ohmic contact with the field effect control layer and configured to couple to a positive electrode of the external voltage source wherein at least a second portion of the second metal electrode protrudes laterally from and away a second side edge of the field effect control layer,
wherein a carrier concentration in the graphene conducting layer is increased and a sheet resistance of the graphene conducting layer is reduced when the first metal electrode is connected to the negative electrode and the second metal electrode is connected to the positive electrode.

15. The transparent electrode of claim 14, wherein the field effect control layer has a polar positive charge in a working state.

16. A transparent electrode, comprising:
a substrate;
a graphene conducting layer disposed above the substrate;
a field effect control layer comprising a transparent material, wherein the field effect control layer has a polarity charge;
a dielectric layer disposed between the graphene conducting layer and the field effect control layer;
a first metal electrode in ohmic contact with the graphene conducting layer and configured to couple to a negative electrode of an external voltage source, wherein at least a first portion of the first metal electrode protrudes laterally from and away a first side edge of the graphene conducting layer; and
a second metal electrode in ohmic contact with the field effect control layer and configured to couple to a positive electrode of the external voltage source wherein at least a second portion of the second metal electrode protrudes laterally from and away a second side edge of the field effect control layer,
wherein a carrier concentration in the graphene conducting layer is increased and a sheet resistance of the graphene conducting layer is reduced when the first metal electrode is connected to the negative electrode and the second metal electrode is connected to the positive electrode.

17. The transparent electrode of claim 16, wherein the field effect control layer has a polar positive charge in a working state.

* * * * *

UNITED STATES PATENT AND TRADEMARK OFFICE
CERTIFICATE OF CORRECTION

PATENT NO. : 11,502,209 B2
APPLICATION NO. : 16/366699
DATED : November 15, 2022
INVENTOR(S) : Xudong Qin, Bo Zhang and Chenxiong Zhang It is certified that error appears in the above-identified patent and that said Letters Patent is hereby corrected as shown below:

In the Claims

Claim 1, Column 19, Line 20: "conducing layer" should read "conducting layer"

Claim 7, Column 19, Line 57: "centimeters $cm^2$" should read "$cm^2$"

Claim 14, Column 20, Lines 33 and 34: "voltage source wherein" should read "voltage source, wherein"

Claim 16, Column 20, Lines 62 and 63: "voltage source wherein" should read "voltage source, wherein"

Signed and Sealed this
Twenty-seventh Day of December, 2022

Katherine Kelly Vidal
*Director of the United States Patent and Trademark Office*